(12) United States Patent
Pandey et al.

(10) Patent No.: US 11,236,603 B2
(45) Date of Patent: Feb. 1, 2022

(54) DYNAMIC INTERPRETATION OF DATA FROM HYDRAULIC FRACTURING

(71) Applicant: CONOCOPHILLIPS COMPANY, Houston, TX (US)

(72) Inventors: Vibhas Pandey, Houston, TX (US); Robert C. Burton, Jr., Houston, TX (US); Alexandre Riel, Tananger (NO)

(73) Assignee: ConocoPhillips Company, Houston, TX (US)

( * ) Notice: Subject to any disclaimer, the term of this patent is extended or adjusted under 35 U.S.C. 154(b) by 225 days.

(21) Appl. No.: 16/018,947

(22) Filed: Jun. 26, 2018

(65) Prior Publication Data

US 2019/0128111 A1    May 2, 2019

Related U.S. Application Data

(60) Provisional application No. 62/524,774, filed on Jun. 26, 2017.

(51) Int. Cl.
| | |
|---|---|
| *E21B 47/06* | (2012.01) |
| *G01V 99/00* | (2009.01) |
| *H03M 7/30* | (2006.01) |
| *E21B 43/26* | (2006.01) |
| *G06F 40/205* | (2020.01) |

(52) U.S. Cl.
CPC ............ *E21B 47/06* (2013.01); *E21B 43/26* (2013.01); *G01V 99/005* (2013.01); *G06F 40/205* (2020.01); *H03M 7/30* (2013.01); *G01V 2210/54* (2013.01); *G01V 2210/624* (2013.01)

(58) Field of Classification Search
CPC ............... G06F 40/205; G01V 99/005; G01V 2210/54; G01V 2210/624; H03M 7/30; E21B 47/06; E21B 43/26
See application file for complete search history.

(56) References Cited

U.S. PATENT DOCUMENTS

| | | | |
|---|---|---|---|
| 6,076,046 A * | 6/2000 | Vasudevan | E21B 43/267 166/250.08 |
| 6,405,136 B1 * | 6/2002 | Li | H03M 7/30 702/10 |
| 8,229,880 B2 | 7/2012 | Boulatsel et al. | |
| 9,140,109 B2 | 9/2015 | Suarez-Rivera et al. | |
| 10,060,241 B2 * | 8/2018 | Xu | E21B 43/267 |
| 2009/0187391 A1 * | 7/2009 | Wendt | G01V 11/00 703/7 |
| 2009/0234584 A1 | 9/2009 | Casey et al. | |
| 2010/0006293 A1 | 1/2010 | Gu et al. | |

(Continued)

FOREIGN PATENT DOCUMENTS

WO    2016134018 A2    8/2016

*Primary Examiner* — Raymond L Nimox
(74) *Attorney, Agent, or Firm* — ConocoPhillips Company

(57) ABSTRACT

Hydraulic fracturing of subterranean formations has become more complex and detailed as information increases. Methods for calculating and monitoring reservoir pressures during treatment provide unique opportunities to adjust treatments on the fly. Treatments include acid fracturing, fracture acidizing, acid stimulation, propped acid fracture stimulation, hydraulic fracturing, slick water based hydraulic fracturing, foamed based hydraulic fracturing, foam based acid fracturing, foamed based acid diversion, any other physical particulate and fiber based hydraulic fracturing or matrix treatment.

14 Claims, 11 Drawing Sheets

(56) References Cited

U.S. PATENT DOCUMENTS

| | | |
|---|---|---|
| 2014/0351183 A1* | 11/2014 | Germain ................ G06N 20/00 706/12 |
| 2014/0367110 A1 | 12/2014 | Montgomery et al. |
| 2015/0039234 A1* | 2/2015 | Abou-Sayed .......... G01V 99/00 702/11 |
| 2015/0159477 A1 | 6/2015 | Lecerf et al. |
| 2015/0218439 A1 | 8/2015 | Dean et al. |
| 2016/0003017 A1 | 1/2016 | Keller et al. |
| 2016/0047230 A1 | 2/2016 | Livescu et al. |
| 2016/0084076 A1 | 3/2016 | Fanini et al. |
| 2016/0102528 A1* | 4/2016 | Wise ..................... E21B 21/062 166/336 |
| 2016/0275133 A1 | 9/2016 | Moore |
| 2016/0334542 A1 | 11/2016 | Chiu et al. |
| 2018/0010429 A1* | 1/2018 | Willberg ............... E21B 49/005 |
| 2018/0230782 A1* | 8/2018 | Pankaj .................. G01V 1/288 |
| 2018/0230784 A1* | 8/2018 | Rodriguez Herrera ...................... E21B 41/0092 |

\* cited by examiner

| Stage | Fluid Type | Volume bbls |
|---|---|---|
| 0 | Well Fluid | 312.9 |
| 1 | Brine | 698.0 |
| 2 | Pad 1 | 558.0 |
| 3 | Acid 1 | 334.0 |
| 4 | Brine 1 | 71.0 |
| 5 | Pad 2 | 599.0 |
| 6 | Acid 2 | 376.0 |
| 7 | Brine 2 | 96.0 |
| 8 | Pad 3 | 713.0 |
| 9 | Acid 3 | 349.0 |
| 10 | Brine 3 | 128.0 |
| 11 | Pad 4 | 775.0 |
| 12 | Acid 4 | 371.0 |
| 13 | Brine 4 | 823.0 |
| 0 | 0 | 0.0 |
| 0 | 0 | 0.0 |
| 0 | 0 | 0.0 |
| 0 | 0 | 0.0 |
| 0 | 0 | 0.0 |
| 0 | 0 | 0.0 |

FIG. 6

| StartRow | 51297 | Trigger | 2 | Previous | 51297 | | 7 | NP Start | | | |
|---|---|---|---|---|---|---|---|---|---|---|---|
| # No | 2084 | | | Current Sta | 0 | | RT S.G. | 8.810 | lbm/gal | | |
| Dens Mul | 1 | | | RT Start Vo | 1909.94 | Max Vol. | 7809.92 | bbls | RT EndRo | 41366 | | |
| Density? | lbm/gal | | | Rt Rate | 0.0033 | | | | | Gage Dept | 14926 | MD, ft |
| | | | | RT Start Tr | 520.66 | Start | 0 | bbls | Sim. Volu | 5899.9 | bbl | Perf Dept | 17626 | 9568.6 TVD, ft |
| | | | | RT Start Ro | 32047.0 | End | 7809.9 | bbls | Well. Vol | 18.00 | Times | Surf. Line | 20 | 10473.3 bbls |
| | | RT CurrRo | 41367.0 | RT End Tim | 664.95 | | | | Enter Pr | 7150 | psi | Vol. for De | 267.0 bbls |
| | | Exit | Yes | RT Row Ino | 10 | | | | Brine PPC | 8.81 | lbm/gal | Enter PC | 8000 psi |
| | | Controls | | Stages | 13 | Start Tm | 520.66 | min | RT Data? | ☒ TRUE | | | |
| | | Write: | | Curr. RT | 664.97 | Curr Tm | 664.97 | min | Rate RT | 0.000 | bbl/min | | |
| | | Time? | Yes | Curr. RT Vol | 7809.8 | | | | | | | | |
| | | Tub Fric? | Yes | | | | | | | | | | |
| | | Pwh? | Yes | | | | | | | | | | |

FIG. 7

| Dedicated to | | Dr. Ken Nolte | | | |
|---|---|---|---|---|---|
| Application Developed By | | Vibhas Pandey | | | |
| | DropDown | | | dat | vbTab |
| File & Path | C:\Users\pandev\Desktop\WellA.rdv | | | txt | vbTab |
| Extension | rdv | | | tpr | vbTab |
| Separator | " " | | | rdv | " " |

FIG. 8

| Job Time | 4 | End | 51284 | I. Header & Units | II. Acquire | III. Record | 10.0 sec | ☑ STOP! | 10 | ##:A$17 | 17 | Q | 35 | Clean All |
|---|---|---|---|---|---|---|---|---|---|---|---|---|---|---|
|  | TR_PRESS | TR_PRESS | AN_PRESS | B_ANNUL | SLUR_RAT | TOT_SLUR | SLUR_DE | J568A_1 | J568A_2 | Xlinker_P | Xlinker_O | BH_Press | Annulus | BH_Temp |
|  | PSI | PSI | PSI | PSI | B/M | BBL | SGRV | GPM | G/MG | G/MG | GPM | PSI | PSI | DEGF |
| #NULL |  |  |  |  |  |  |  |  |  |  |  |  |  |  |

FIG. 9

Step I: Map Channels

| Time | Time | Pwh | Xlinker Rate | Density | BHP | Tot_Fluid | Rate | BHT |
|---|---|---|---|---|---|---|---|---|
| Fixed | Job Time | TR_PRESS | Xlinker_Rate | WLHD_DENS | BHP_GAUGE | TOT_SLURRY | SLURRY_RATE | BH_Temp |
| min | min | PSI | GPM | LB/G | PSI | BBL | B/M | DEGF |
|  | A | B | K | H | L | G | F | N |

FIG. 10

Step I: Map Channels

| Time | Time | Pwh | Xlinker Rate | Density | BHP | Tot_Fluid | Rate | BHT |
|---|---|---|---|---|---|---|---|---|
| Fixed | Job Time | TR_PRESS | Xlinker_Rate | WLHD_DENS | BHP_GAUGE | TOT_SLURRY | SLURRY_RATE | BH_Temp |
| min | min | PSI | GPM | LB/G | PSI | BBL | B/M | DEGF |
|  | A | B | K | H | L | G | F | N |

FIG. 11A

| | 4 | | End | 51284 | I: Header & Units | | II: Acquire | | III: Record | 10.0 sec | ☑ STOP! | 10 | ##AS17 | | 17 | Q | 35 | |
|---|---|---|---|---|---|---|---|---|---|---|---|---|---|---|---|---|---|---|
| | TR_PRESS | TR_PRESS | AN_PRESS | B_ANNUL | SLUR_RAT | TOT_SLUR | SLUR_DE | J568A_1 | J568A_1 | J568A_2 | J568A_2 | J568A_2 | Xlinker_P | Xlinker_O | BH_Press | Annulus_ | BH_Temp |
| Job Time | PSI | PSI | PSI | PSI | B/M | BBL | SGRV | GPM | GMG | GPM | GMG | GPM | GPM | GMG | PSI | PSI | DEGF |
| #NULL | | | | | | | | | | | | | | | | | |
| 23:09:16:09:39:57 | 5.09254 | -13.2179 | 16.5366 | 0 | 0.00E+00 | 0 | 1.0472 | 0 | 0.00E+00 | 2.61E+18 | 1.76E+16 | 0.00E+00 | 0.00E+00 | 5118.76 | 3975.2 | 119.275 |
| 23:09:16:09:39:58 | 4.23424 | -13.504 | 16.5366 | 0 | 0.00E+00 | 0 | 1.0472 | 0 | 0.00E+00 | 2.61E+18 | 1.76E+16 | 0.00E+00 | 0.00E+00 | 5118.76 | 3975.2 | 119.275 |
| 23:09:16:09:39:59 | 4.23424 | -13.7901 | 16.6944 | 0 | 0.00E+00 | 0 | 1.04726 | | | 2.61E+18 | 1.76E+16 | 0.00E+00 | 0.00E+00 | 5118.79 | 3975.19 | 119.275 |
| 23:09:16:09:40:00 | 4.23424 | -13.7901 | 16.2805 | 0 | 0.00E+00 | 0 | 1.04726 | 0.00E+00 | 0.00E+00 | 2.61E+18 | 1.76E+16 | 0.00E+00 | 0.00E+00 | 5118.79 | 3975.19 | 119.275 |
| 23:09:16:09:40:01 | 4.23424 | -13.7901 | 16.5366 | 0 | 0.00E+00 | 0 | 1.04726 | 0.00E+00 | 0.00E+00 | 2.61E+18 | 1.76E+16 | 0.00E+00 | 0.00E+00 | 5118.79 | 3975.19 | 119.275 |
| 23:09:16:09:40:02 | 4.52034 | -13.2179 | 16.2805 | 0 | 0.00E+00 | 0 | 1.04726 | 0.00E+00 | 0.00E+00 | 2.61E+18 | 1.76E+16 | 0.00E+00 | 0.00E+00 | 5118.78 | 3975.19 | 119.275 |
| 23:09:16:09:40:03 | 4.23424 | -13.7901 | 16.2805 | 0 | 0.00E+00 | 0 | 1.0473 | 0.00E+00 | 0.00E+00 | 2.61E+18 | 1.76E+16 | 0.00E+00 | 0.00E+00 | 5118.78 | 3975.19 | 119.275 |

FIG. 11B

| Step I: Map Channels | | | | | 1 | | | | |
|---|---|---|---|---|---|---|---|---|---|
| Time | Time | Pwh | Xlinker Rate | Xlinker Rate | Density | BHP | BHP | Tot_Fluid | Rate |
| Fixed | Job Time | TR_PRESS | Xlinker_Rate | Xlinker_Rate | SLUR_DE | BHP_PRESS | BHP_PRESS | TOT_SLURRY | SLUR_RATE |
| min | min | PSI | GPM | | SGRV | PSI | | BBL | B/M |
| | A | B | M | | H | O | | G | F |
| 23:09:16:0 | 0.016667 | 5.09254 | 0 | | 8.72318 | 5118.76 | | 0 | 0 |
| 23:09:16:0 | 0.033333 | 4.23424 | 0 | | 8.72318 | 5118.76 | | 0 | 0 |
| 23:09:16:0 | 0.05 | 4.23424 | 0 | | 8.72368 | 5118.79 | | 0 | 0 |
| 23:09:16:0 | 0.066667 | 4.23424 | 0 | | 8.72368 | 5118.79 | | 0 | 0 |
| 23:09:16:0 | 0.083333 | 4.23424 | 0 | | 8.72368 | 5118.79 | | 0 | 0 |

FIG. 12A

DYNAMIC INTERPRETATION OF DATA FROM HYDRAULIC FRACTURING

CROSS-REFERENCE TO RELATED APPLICATIONS

This application is a non-provisional application which claims benefit under 35 USC § 119(e) to U.S. Provisional Application Ser. No. 62/524,774 filed Jun. 26, 2017, entitled "DYNAMIC INTERPRETATION OF DATA FROM HYDRAULIC FRACTURING," which is incorporated herein in its entirety.

STATEMENT REGARDING FEDERALLY SPONSORED RESEARCH

None.

FIELD OF THE INVENTION

The present invention relates generally to hydraulic fracturing of subterranean formations. More particularly, but not by way of limitation, embodiments of the present invention include acid fracturing, fracture acidizing, acid stimulation, propped acid fracture stimulation, hydraulic fracturing, slick water based hydraulic fracturing, foamed based hydraulic fracturing, foam based acid fracturing, foamed based acid diversion, any other physical particulate and fiber based hydraulic fracturing or matrix treatment.

BACKGROUND OF THE INVENTION

Hydraulic fracturing or "fracking" is the propagation of fractures in a rock layer by a pressurized fluid. The oil and gas industry uses hydraulic fracturing to enhance subsurface fracture systems to allow oil or natural gas to drain more freely from the reservoir to production wells that bring the oil or gas to the surface. However, there many uses for hydraulic fracturing outside of the petroleum industry, including to stimulate groundwater wells, to precondition rock for cave in mining, to enhance waste remediation processes, to dispose of waste by injection into deep rock formations, including $CO_2$ sequestration, to measure the stress in the earth, and for heat extraction in geothermal systems.

In hydraulic fracturing, an injection fluid, usually including water or brine and a polymer, is injected into a reservoir at pressures high enough to fracture the rock. The two main purposes of fracturing fluid or "frack fluid" in oil reservoirs is to extend fractures in the reservoir and to carry proppants, such as grains of sand, into the formation, the purpose of which is to hold the fractures open after pressure is removed without damaging the formation or production of the well. The polymer thickens the fracturing fluid, allowing it to more effectively carry the proppant deeper into the reservoir.

Without hydraulic fracturing, the time needed to drain a field would be inordinately long—in a tight field it could be in the order of hundreds of years. The only way to drain the oil in a reasonable time is to drill more wells—e.g., up to 40 wells per square mile in a tight field—a very expensive undertaking, or to fracture the field. The existence of long fractures allows the fields to be drained in a reasonable time, with fewer wells, and in a cost-effective way.

Since hydraulic fracturing was introduced in 1949, close to 2.5 million fracture treatments have been performed worldwide. Some believe that approximately 60% of all wells drilled today are fractured. Fracture stimulation not only increases the production rate, but it is credited with adding to reserves—9 billion barrels of oil and more than 700 Tcf of gas added since 1949 to US reserves alone—which otherwise would have been uneconomical to develop. In addition, through accelerating production, net present value of reserves has increased. Subterranean hydrocarbon bearing formations are routinely fracture stimulated to enhance well productivity and improve well performance.

The current process, involves pumping non-reactive fluid often termed as "pad" under high pressure down the well tubular to the target hydrocarbon-bearing formation in order to generate a hydraulic fracture which creates a conductive pathway to enable easy flow of fluids (oil/gas/condensate, etc.) into the well during production phase. While in traditional "propped" fracture treatments the fracture is held open using proppants after the pumping stops, in the acid fracturing case, the dissolution of rock face during the treatment phase result in surface asperities that help retain conductive pathways after the pumping stops.

However, in acid fracturing treatments, as the acid contacts the soluble rock and dissolves it, the in-situ stresses are simultaneously relieved and the reservoir face pressure drops. This causes the net pressure to decrease, which below a pre-defined threshold, will cause the fracture to stop propagating and ultimately lead to fracture closure even while the fluids are being injected. To prevent this rapid closure, changes may be required to the pumping parameters to keep the fracture open, but this requires accurate knowledge of fracture entry or reservoir face pressures during injection. If the fracture closes during injection phase, the acid will spend in the near wellbore region which can (a) limit well productivity as desired etched fracture geometry will not be achieved and (b) dissolve excessive formation in near wellbore region which can have a negative impact on the well integrity in the long term.

To improve Acid Fracturing treatments, the effective pressures applied to the formation must exceed the stresses that tend to close the fracture as the in situ stresses are continuously relieved because of acid-formation reaction and subsequent rock dissolution. If during the treatment, the effective reservoir face pressures fall below the known closure stresses of the formation, the hydraulic fractures will cease to extend and the injected acid is no longer effectively transported deeper along the fracture face. The desired fracture geometry will thus not be achieved resulting in a sub-optimal well performance. Knowledge of effective bottomhole treating pressures during the treatment is thus critical to the success of any Acid Fracturing treatment because they can help in taking appropriate decisions and steps to maximize the benefit from the treatment. Current tools available in the industry do not perform these calculations accurately which often leads to incorrect conclusions and compromised well productivity.

Unfortunately, current tools do not provide the combination of live-streaming data, data processing and conversion, graphical display and correlate those changes with well treatment as it occurs. In order to respond to well conditions in an efficient and effective way a better method of analyzing and displaying well conditions in real time is required.

SUMMARY OF THE DISCLOSURE

To mitigate bottomhole treatment pressures issues a calculator has been developed to evaluate the recorded data in a live-mode and continuously inform the user of the existing bottom hole reservoir face pressure.

The invention more particularly includes, a method for treating a hydrocarbon formation by providing a well in a hydrocarbon formation, the well having one or more systems to measure well parameters; assembling the well parameters into one or more data packets for transmission; transmitting one or more data packets from the well to a processor; receiving one or more data packets at the processor; aligning the data from one or more data packets with one or more additional sets of data; parsing the data by parameter into relevant datasets; transforming the relevant datasets into flow rate and pressure; correcting the relevant datasets; graphing the relevant datasets for a range; and dynamically changing one or more well processes.

In one embodiment, a method for fracturing a hydrocarbon formation by providing a well in a hydrocarbon formation where the well comprises one or more systems to measure well parameters; assembling the well parameters into one or more data packets for transmission; transmitting one or more data packets from the well to a processor; receiving one or more data packets at the processor; aligning the data from one or more data packets with one or more additional sets of data; parsing the data by parameter into relevant datasets; transforming the relevant datasets into effective frictional pressure and effective reservoir face pressure; correcting the relevant datasets; graphing the relevant datasets for a range; and dynamically changing one or more well processes.

In another embodiment, a system for treating a hydrocarbon formation comprises providing a well in a hydrocarbon formation, where the well comprises one or more systems to measure well parameters; a transmitter for transmitting data packets to a processor; a processor for receiving data packets from a transmitter; a monitor for displaying one or more graphs; where the transmitter assembles well parameters into one or more data packets for transmission and transmits one or more data packets from the well to the processor; where the processor receives one or more data packets from the transmitter and aligns the data from one or more data packets with one or more additional sets of data; parses the data by parameter into relevant datasets; transforms the relevant datasets into flow rate and pressure; corrects the relevant datasets; and graphs the relevant datasets for a range.

In an additional embodiment, a system for fracturing a hydrocarbon formation comprises providing a well in a hydrocarbon formation where the well comprises one or more systems to measure well parameters; a transmitter for transmitting data packets to a processor; a processor for receiving data packets from a transmitter; a monitor for displaying one or more graphs; where the transmitter assembles well parameters into one or more data packets for transmission and transmits one or more data packets from the well to the processor; where the processor receives one or more data packets from the transmitter and aligns the data from one or more data packets with one or more additional sets of data; parses the data by parameter into relevant datasets; transforms the relevant datasets into effective frictional pressure and effective reservoir face pressure; corrects the relevant datasets; and graphs the relevant datasets for a range.

In one embodiment, the relevant data may be rejected if the data parameters fall outside a specified error.

In another embodiment, the data may be aligned based on MD, TVD, time, or a combination thereof.

In an additional embodiment, the relevant dataset may be corrected using the closure pressure data, historical data, a data model, or a combination thereof.

In another embodiment, the dynamically changed well process may be Pump Schedule Volumes, fluid description, data acquisition frequency, or a combination thereof.

| Abbreviation | Description |
| --- | --- |
| Bbls | Barrels |
| BHP | Bottom Hole Pressure |
| BHPGauge | Bottom Hole Pressure Gauge |
| BHPAdj | Adjusted BHP |
| BPM | Barrels Per Minute |
| DBMS | DataBase Management System |
| GPM | Gallons Per Minute |
| MD | Measured Depth |
| ID | Internal Depth |
| MPa | MegaPascal |
| Pc | Closure Pressure |
| PPG | Pounds Per U.S. Gallon |
| Presface | Reservoir Face Pressure |
| psi | Pound force per square inch |
| PTA | Pressure Transient Analysis |
| Pwh | Well Head Pressure or Treating Pressure |
| RT | Real Time |
| SQL | Structured Query Language |
| Tcf | Trillion Cubic Feet |
| TR Pressure | Treating Pressure |
| TVD | True Vertical Depth |
| VPN | Virtual Private Network |

As used herein, "Bottom Hole Pressure" or BHP refers to the pressure at the bottom of the well or the top of the perforation. One way to acquire bottom hole pressure in hydraulic fracturing is to install downhole pressure gauges. In horizontal wells, downhole gauges are usually installed at the vertical section though in some cases they may be installed very close to the perforation set through which the fluid will be injected during fracturing operations. In the former case, the pressure at the top of the perforation can be calculated with hydrostatic head and tubular frictional pressure along the lateral section. With downhole gauges in place, the frictional pressure model along the treatment tubular (casing or tubing) can be calibrated through injection tests. In some cases, bottom hole pressure is calculated through "dead strings", or annulus when slurry is pumped through tubing As used herein, "Well survey data" refers to existing well data typically acquired during planning, drilling, and surveying prior to or as a part of completion. Well survey data may include MD (Measured Depth), well inclination or TVD (True Vertical Depth), "Wellbore" refers to Description of various Tubular in the work-string which will be exposed to pumping fluids during operations. These are described by length and internal diameter (ID).

Perforation Description refers to Total Number of Perforations, Average Diameter of Perforations and Discharge Coefficients "Cd". Similar dimensions to be entered for other restrictions such as Ball Seats, Frac Baffles, constrictions in tubular and others.

Entry of Data for Pump Schedule. Include any number of pump schedule stages. Pump Schedule Fluids can be assigned on-the-fly as the data is being acquired and individual also the respective stage volumes.

Entry of Data for Pump Schedule. Fluid Type could be on basis of pump schedule employed; some examples, Wellbore Brine, Brine, Water, Slick-water, Linear Gel, Cross-linked Gel, PAD, Acid, Gelled Acid, Foamed Acid, Delayed Acid, Retarded Acid, Live Acid and Others.

Entry Data for Pump Schedule. Proppant Concentration, Divertor Concentrations, Foam Quality, Foam Gas Type, Foam Design Method—Constant Phase or Quality, Proppant Type, Proppant Size and Density, Proppant Friction Tables, Additive Concentrations, Additive Types.

Bottomhole pressure (BHP) gauge—Depth is defined here in Measured Depth. True vertical depth of the gauge is obtained using the knowledge of wellbore deviation.

BHP gauge data can be obtained from quartz gauges, optical fiber gauge, any type of pressure gauge hooked up to wellbore and capable of providing data in live mode or in memory mode for post-treatment analysis.

As used herein, a "Database" is an organized collection of data or information stored in one or more processors in a way that that supports processing. Data may be stored in schemas, tables, queries, reports, views, continuous correlations, and other objects.

As used herein, a database management system (DBMS) is a computer software application that interacts with the user, other applications and the database to capture and analyze data. DBMS's include Microsoft Excel, Microsoft Access, MySQL, PostgreSQL, MongoDB, MariaDB, Microsoft SQL Server, Oracle, Sybase, SAP HANA, MemSQL, IBM DB2, or other database management system.

As used herein, "Data Streaming" or "Real Time Data Processing" is the process of transferring a data or a stream of data from one place to another through a network—either physical or virtual—that may include wired, wireless, or any combination thereof for data transmission, Cloud, Real Time Data Repository and others.

As used herein, "Data Packet" is a fixed amount of data over a period of time and/or containing a predefined set of data. In one embodiment a data packet may be data collected over a period of seconds, minutes, hours, or days as defined by the user or the data processing. In another embodiment a data packet may be a specific collection of data parameters including BHP,

BRIEF DESCRIPTION OF THE DRAWINGS

A more complete understanding of the present invention and benefits thereof may be acquired by referring to the follow description taken in conjunction with the accompanying drawings in which:

FIG. 6 shows inputs used to initiate the calculation in a treatment.

FIG. 7 shows the file information required.

FIG. 8 shows an example header of treatment data being acquired/analyzed.

FIG. 9 shows an example of headers mapped to channels.

FIG. 10 shows data acquisition from a file: acquisition phase. (A and B).

FIG. 11A shows data acquisition from streaming data. FIG. 11B shows mapped data for plots.

FIG. 12 B shows output plot.

DETAILED DESCRIPTION

Figure 1:
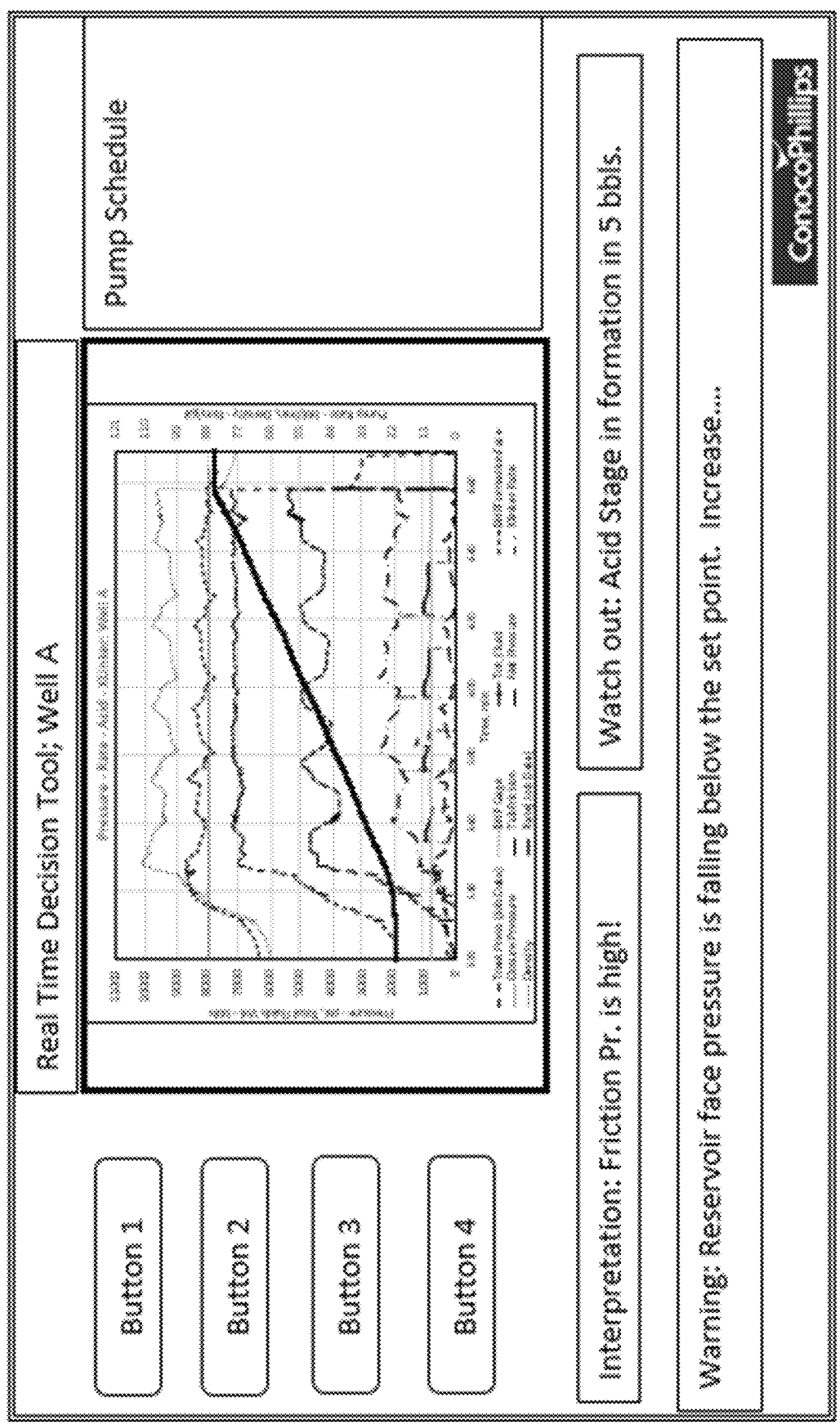
FIG. 1 is an example user Interface and front panel of Tool.

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

Data may be collected and analyzed for multiple treatments including acidizing, acid fracturing, propped fracturing, foamed fracturing, or a combination of treatments. Data may also be collected for other fluids at different well states, including fluids pumped before, during, or after stimulation. Fluids may include pump water, wash fluids, inhibited acids, drilling fluids, sand-carrying fluids, other fluids, or a combination of fluids.

In one embodiment the following procedural steps are performed:

1. A database is prepared for data import. The database may be a spreadsheet, database, table, or other structured data format.
2. Post-stimulation pumping data files are imported. Data may be imported in "static mode" or data may be received during stimulation in "live" mode as it is being published from well data. Datafiles may be in any of a number of formats including *.csv, *.xls, *.txt, *.ascii, *.xml, *.html or other file type.
3. A processed data stream is transmitted from location to the application either directly, via a streaming data source, wirelessly, or through a secure (VPN) internet connection.
4. The data is parsed into a header and main data stream and may be arranged into one or more formats.
5. To receive data following steps may be performed:
    a. If required, remove previous data using "Clear Data" or by creating a new file
    b. Point the application to one or more data files to be loaded by specifying the location, directory, FTP site, IP address, file or other unique identifier.
    c. Load data headers—the application identifies parsed header data and arranges datafields into one or more pre-defined formats dependent upon header and data available.
    d. Optionally, the user may map unidentified headers or channels to specific fields or a predefined format may be used for data that is being sent using a previous or known format. Channels may include Job Time, Bottomhole Pressure, Surface Treating Pressure—Main and/or Backup, Pump Rate, Acid Concentration, Proppant Concentration, Total Clean Fluid Volume, Total Slurry Volume, Nitrogen Rate, Liquid $CO_2$ (Carbon dioxide) rates, Slurry Density, Wellhead Density, Specific Gravity, or other relevant dataset.
    e. Additionally, optional operations may be conducted on incoming data to normalize, scale, or otherwise manipulate the incoming data. In one embodiment, the data is process to a final value through two steps:
        i. Multiply Incoming data by _____
        ii. Offset Incoming data by + _____ or − _____
        iii. Final Value: Data=Data×(Multiplier)±Offset 6. Start data acquisition process "Acquire" which loads the live or static data into a table or worksheet.
7. Start recoding process to "Record" the data at selected time interval and update the data table by appending the additional processed data rows to previous data rows.
8. Graphically present data to the user in a specified time interval—allowing the user to monitor the process.

In another embodiment, the procedure may be described as:

1. The user first fills in the anticipated pumps schedule which will be used for carrying out real time simulations and used in decision making process.
2. The user first assigns the point in time "Start Range" point from where the calculations are to be done. In post-treatment mode, the user also sets the end of the range. In "real-time" mode there is no end point as the data is arriving in live mode.
3. Application first tracks the movement of fluid in the pipe. This is done with knowledge of (a) wellbore description and volume capacity per unit length, (b) incoming fluid type from pump schedule and existing fluid in the wellbore, (c) pump rates at the surface, (d) Nitrogen and Liquid $CO_2$ volume factors and surface quality and perceived wellbore temperature gradients while pumping.
4. In incoming data from live mode is then converted to a computed time-based data stream where rows pertaining to and capturing various fluid type are defined. The "sections" of the data rows that correspond to various fluid types are now used to compute hydrostatic pressure as shown in following step.
5. The knowledge of fluids columns in the wellbore is then converted to respected hydrostatic pressure columns of each fluid type using (a) wellbore deviation information, (b) length of column and dynamic changes of column length based on tubular internal diameter and fluid movement, and (c) fluid specific gravity of individual fluid columns in the pipe. General relation for computing hydrostatic pressure is: Phyd (psi)=0.052× Fluid Density (lbm/gal)×Section Length (ft) for individual fluid column representing one fluid type. Because all fluid movements are tracked, a composite and dynamic hydrostatic pressure is generated by constantly summing up the hydrostatic pressure. This hydrostatic pressure is generated for both "at gauge depth" and "at perforation depth".
6. In a similar fashion, a friction pressure library is generated by using the knowledge of row numbers representing any particular fluid type in the pump schedule pre-defined by the user, e.g. x-linked fluid, linear fluid, brine, slickwater, acid, etc. where the data channel showing pump rates, bottom hole pressure gauge (BHPgauge) data, surface pressure data (Pwh) and fluid hydrostatics (Phyd) at the BHP gauge is used to generate composite tubular friction pressure using following relation:

$Pfric = Pwh + Phyd - BHPgauge$, which is assigned in a separate column as continuously generate friction pressure data.
7. Using the pump rate data and continuously generate friction pressure data, and along with the knowledge of specific rows in the computed data set that have captured a given fluid type, fluid friction pressure gradient for this fluid type can now be generated and used for 2 purposes: (a) to re-calculate Pwh to check the validity of generated tubular frictional pressure data (QA/QC of calculations) and (b) to determine the tubular friction of the fluid below the gauge. The rate vs. friction pressure data is generated by a linear interpolation function (not patented here).
8. Recognizing that the tubular diameters may vary below the BHP gauge, a factor is applied to generated friction pressures. This factor defines the ratio of ideal friction pressure drop in tubular above and below the pressure gauge. This is done by first generating friction factor f using Colebrook Equation such as:

$$\frac{1}{\sqrt{f}} = -2.0 \log\left(\frac{\varepsilon}{3.7D} + \frac{2.51}{Re\sqrt{f}}\right)$$

Where f is Fanning friction factor, e is absolute pipe roughness (inches), D is pipe internal diameter (inch) and Re is Reynold's Number given by $\rho VD/\mu$ and converted to general oilfield units as:

$Re = 50.66 \times Q \times \rho / (D \times \mu)$ where, Q is pump rate in U.S. gallons per minute, D is in inches and $\mu$ is fluid viscosity in cP (centipoise). Fanning Friction factor is generated using an iterative calculator and subsequently friction pressure drop is generated using following relationship:

$\Delta p (psi) = 2.161 \times 10^{-4} (f \times L \times \rho \times Q^2 / D^5)$ where L is length of pipe segment in ft, $\rho$ is fluid density in lbm/ft$^3$, Q is pump rate in U.S. gallons per minute and D is pipe internal diameter in inches.
9. The factor is applied to projected frictional pressure below the BHP Gauge. A continuous time based curve of Friction Factor is also generated to check the relative reduction of frictional pressures after adding friction reducer to the fluid.
10. In the last step, pressure drop in the perforation and ball seats are calculated using following relationship:

$$\Delta p_{pf} = \frac{0.2369 Q^2 \rho_f}{C_d^2 n^2 d^4}$$

Where Q is pump rate in bbl/min, pf is fluid density in lbm/gal, Cd is discharge coefficient (unitless), n are number of holes and d is diameter of orifice/perforation in inches. Here values are Cd are input for each fluid type based on experimental data and number of holes are entered for each stage in pump schedule starting with the value obtained in pre-treatment injection as first input. In case these tests are not conducted then a reasonable value using past experience may be used.
11. Finally, Bottom Hole Reservoir Face Pressure is calculated using following relation:

$BHRFP = BHP_{Gauge} - P_{pf} - P_{bgtf} + P_{hydperf}$ where, BHPGauge is recorded Bottomhole gauge pressure, $P_{pf}$ is perforation friction, $P_{bgtf}$ is tubular friction below gauge, $P_{hydperf}$ is hydrostatic pressure below the gauge up to perforation depth.
12. After determining the BHRFP, using user's input of Formation Closure Stresses or Closure Pressure Pc, Net Pressure is determined as Net Pressure = BHRFP − Pc 13. Depending on negative or positive value of Net Pressure the tool is now able to predict if during pumping the pressures are above or below the fracture closure pressure.
14. Bottom hole injection pressure $BH_{INJP}$ at the perforations is calculated as:

$$BH_{INJP} = BHP_{Gauge} + P_{hydperf} - P_{bgtf} - P_{bgSeat}$$

where, BHPGauge is recorded Bottomhole gauge pressure, $P_{bgSeat}$ is ball seat friction, $P_{bgtf}$ is tubular friction below gauge, $P_{hydperf}$ is hydrostatic pressure below the gauge up to perforation depth. This pressure is thus inclusive of perforation friction only.

This reservoir model is based on pre-treatment log based data. The model is then corrected by using the closure pressure data determined after analyzing the pressure fall-off from pre-treatment mini injection test. This value is also used as a reference pressure on which the advisor is based.

One benefit is that the tool can generate effective reservoir face pressure profiles for a given fracturing treatment in live mode or for evaluation data after stimulation. By providing a real-time display of effective reservoir face pressure along with an analysis of current status—e.g. above or below a critical threshold.
  a. In the form of data graph that will update as the treatment progresses. See FIG. 2 below.
  b. Present Summary & Advise the user. See FIG. 1.

Automatically match the measured bottom hole pressure gauge data during the treatment and generate effective frictional pressure curves.

Project the expected reservoir face pressures as the pumping continues by using the data collected till a given point and update the forecast as conditions change.

9) Assist the user in making real time "on-the-fly" decisions—for e.g. rate changes, schedule changes, and others, using a "Advisor" tool to guide future decisions (but with disclaimers as the data will be presented in good faith and not owning any liability).
10) Allow the user to select the start and end times for which the analysis needs to be done.
11) Allow the user to over-ride the measured data if necessary and tap into the library of frictional pressure data.
12) Allow the user to upload the frictional pressure data to the library/database if so desired.
13) Allow the user to dynamically change the following without interrupting the calculations:
  a. Pump Schedule Volumes
  b. Change or refine the fluid description as needed
  c. Change data acquisition frequency Additionally, the data stream may be ported as an input channel during acquisition. In another embodiment, live bottom hole data from a variety of data sources, including well operator, service provider, heel and/or toe gauges, and other data sources may be utilized to add to or verify existing data, supplement the data, or improve resolution as required.

Temperature data may be obtained from a bottomhole gauge often at shallower depth than injection point. Temperature data from the bottomhole gauge may be used to calibrate temperature distribution in the wellbore. The bottomhole gauge temperature may also be extrapolated for injection point temperature and/or used as a valid input for fracturing fluid and acid selection design.

Data may be collected through an automated "sweep" (run passively) on several treatments pumped in the past to generate data library to evolve multiple treatment data, model future treatments, or confirm the efficiency of previous treatments.

In the live mode, effective formation face pressure is used to generate net pressure in the fracture. With knowledge of available net pressure in fracture, fracture height in layered formation and width of the fracture is obtained using pre-calculated tables based on layered mechanical property data. As a next step fracture length is determined and hence we have on-the-fly fracture geometries.

Using the on-fly-geometry and other description, an on-the-fly production forecast of the fracture is also generated. Depending on the volume being pumped, on-the-fly cost estimates are generated which will increase with pump time; ultimately cost and expected production from this dynamic tool is used to generate Net Present Values curves on the fly to help in decision making process.

Output calibration is done continuously with post-treatment production database, fracture pressure database and fracture attributes database to close the gap between forecast and measured data.

Parameters imported from streaming well data include Job Time, Bottomhole Pressure, Surface Treating Pressure—Main and Backup, Pump Rate, Acid Concentration, Proppant Concentration, Total Clean Fluid Volume, Total Slurry Volume, Nitrogen Rate, Liquid $CO_2$ rates, Slurry Density, Wellhead Density, Specific Gravity.

Materials & Methods:

Tool can be installed in—Laptops, PC workstations, Tablets, Smart Phones, Instrument Panels, Touchscreen Panels and other devices that support that and other such visual tools.

Figure 2:
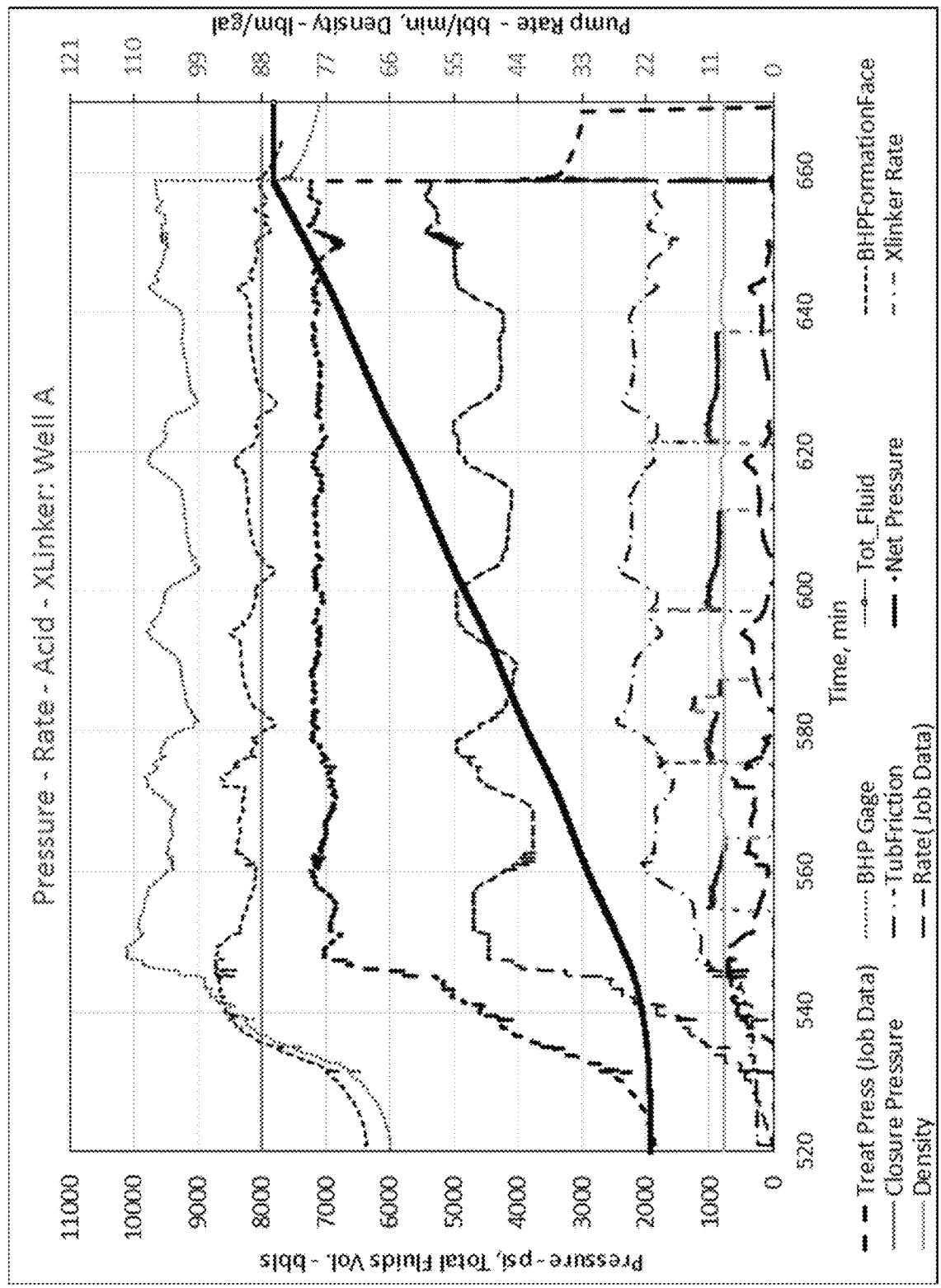
FIG. 2 is a Well Data Graph.

In one embodiment, data packets are received from one or more data sources. An example interface is shown in FIG. 1. The data is aligned with one or more additional data sets based on MD, TVD, time, or other parameter. The data is parsed by parameter into relevant datasets based on header or other identifier. Data is transformed using into effective frictional pressures, hydrostatic pressures, effective reservoir face pressures, net pressures, frictional pressure data ratio, bottom hole injection pressure. Data is corrected using the closure pressure data, historical data, and/or a data model. Data is graphed continuously for a relevant period—depending upon the fracture stage—it may be for several hours or several days. An example graph is shown in FIG. 2. If data parameters do not meet modeled parameters, or if data parameters fall outside a specified error, the data may be rejected, replaced, and/or the model may be corrected to account for differences.

The following examples of certain embodiments of the invention are given. Each example is provided by way of explanation of the invention, one of many embodiments of the invention, and the following examples should not be read to limit, or define, the scope of the invention.

EXAMPLE 1

Figures 3A, 3B:
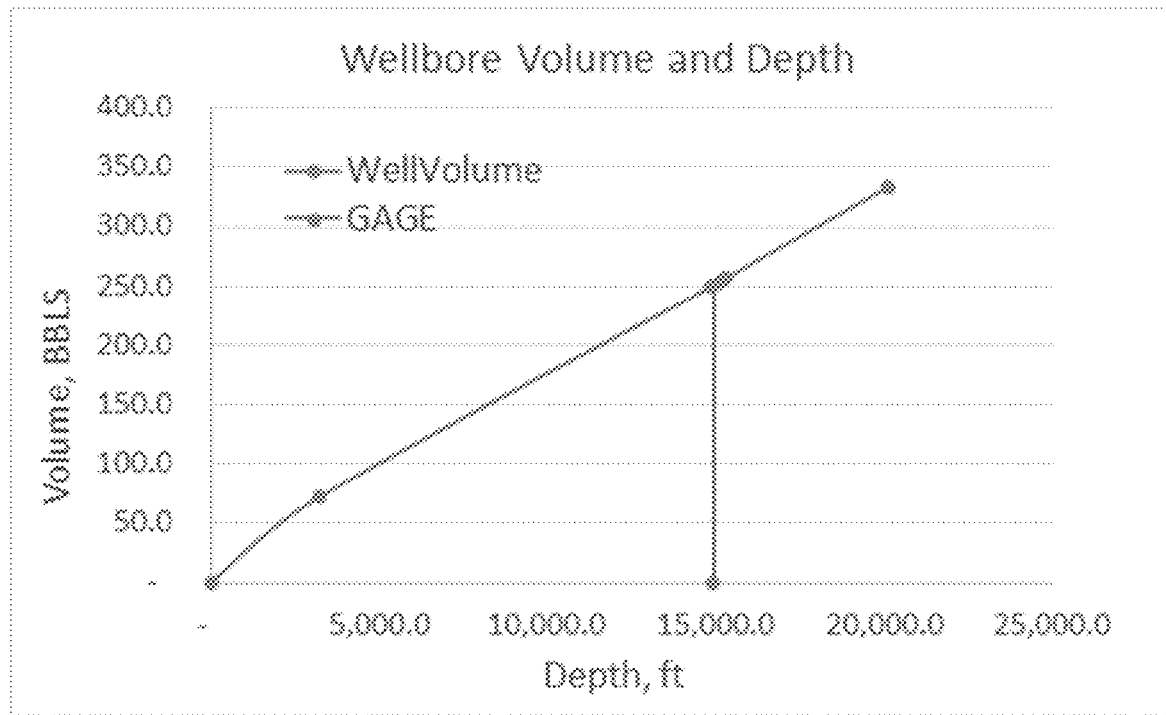
FIG. 3A is a Tubular Description
FIG. 3B is a Wellbore Volume map.

Enter Wellbore Data: Including Perforations/Sleeves/Ball Seat Details—ID and Depths. FIG. 3A is a depiction of a well bore including volume per foot (capacity), segment length, total volume, depth at end, and internal diameter measurements for several sections of well. FIG. 3B shows total volume in barrels over the length of the well bore.

Figures 4, 5:
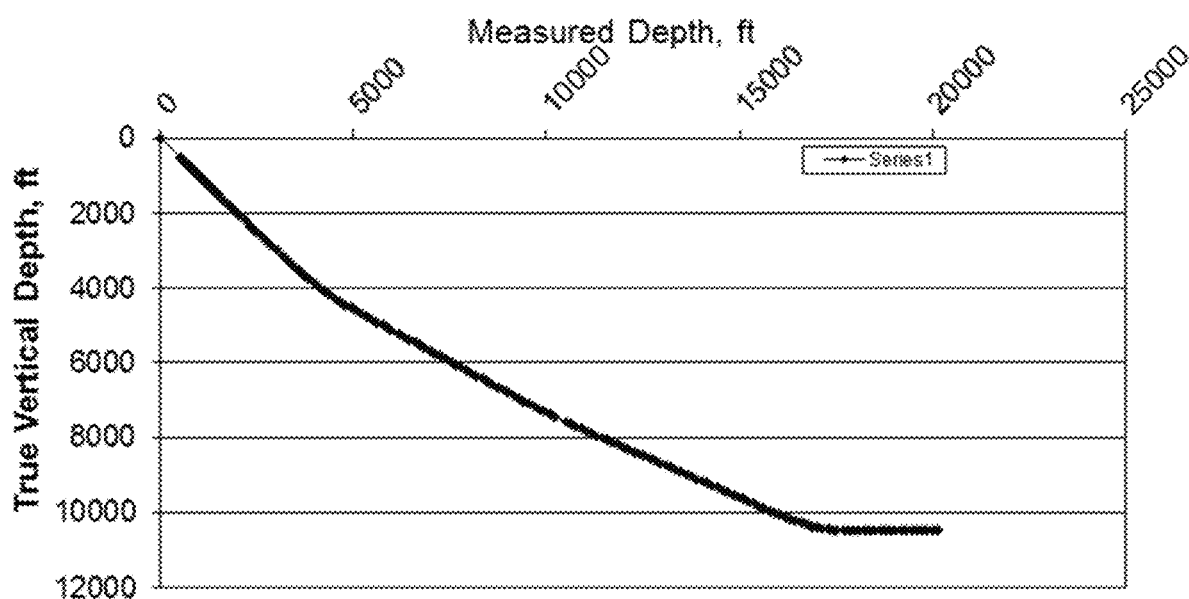
FIG. 4 shows Wellbore Survey and Deviation data.
FIG. 5 shows an example Pump Schedule.

Enter Wellbore Deviation Data. FIG. 4 depicts wellbore MD vs TVD in ft.

Enter Pump Schedule Details—Volumes and Fluid Types FIG. 5 depicts an example pump schedule including fluid and volume to be pumped. In some embodiments, rate, viscosity, concentrations, pump type or types, pressure, maximum or minimum values, anticipated or modeled values, or other parameters may be included in the pump schedule.

Define Other Inputs and set simulator controls. FIG. 6 shows one example of some inputs used to monitor a treatment including data start row, number of data rows, a density multiplier and density units, start volume, rate, start time, end time, data start row and end row, start barrels, end barrels, total barrels, simulation volume, well volume, well pressure, gauge depth in MD and/or TVD, perforation depth, volume to perforation, closure pressure, and other parameters that may be relevant. Some of the data may be entered by the user, calculated from the data file, or formatted based on previous data.

Setup File Data to be imported real time and point the drop down in front of "File & Path" to the Real Time (or passive) file. FIG. 7 depicts the file information required to import either a live data stream or previous data for analysis. The box on right shows the file types that can be identified and the type of data stored in that file type. In one embodiment the user may enter the file extension and the data contained therein, where a data file (.dat, .txt, .tpr, .rdv, .html, .xml, etc.) may contain comma separated values (csv), tab separated data (vbtab), other delimited values, tables, or any of a variety of data formats. The user can set either an incoming file and location, the outgoing file after processing, or both dependent upon source and datatypes. In one embodiment multiple different data files may be imported with different names, extensions, data structures, and parameters. Each data file or data type may be identified by the user or by information in the data file itself.

In one embodiment the data header may be imported. FIG. 8 depicts an example header including the header and column units. The header includes Treatment pressure, Annulus pressure, slurry rate, slurry volume, treatment title, treatment rate, crosslinker volume, crosslinker rate, and bottom hole temperature. Additional information may be imported with the header including file information, well information, company information, date, time, auditing information, and the like.

Map Channels to data using drop down menu in blue fonts. Data may be mapped to channels either by the user or automatically based on known headers. In one embodiment the data is mapped based on previous header information, then reviewed and adjusted by a user. FIG. 9 depicts an example of headers mapped to channels where the JobTime is mapped to the time channel, "TR_PRESS" is mapped to treatment pressure, "Xlinker_Rate" is mapped to crosslinker, "WLHD_DENS" is mapped to density, "BHP_GAUGE" is mapped to bottom hole pressure, "TOT_SLURRY" is mapped to total fluid, and "SLURRY_RATE" is mapped to pumping rate. Dependent upon the data format and fields available additional channels may be mapped and/or calculated channels may be assigned.

Acquire Data to Import File—Green box shows data from file that is now read into a worksheet or table. FIG. 10 depicts a data acquisition from a file. The highlighted box shows imported data for the same channels mapped from the header information. The data for "JobTime" is mapped to the time channel, the "TR_PRESS" is mapped to the treatment pressure, "Xlinker_Rate" is mapped to crosslinker, "WLHD_DENS" is mapped to density, "BHP_GAUGE" is mapped to bottom hole pressure, "TOT_SLURRY" is mapped to total fluid, and "SLURRY_RATE" is mapped to pumping rate. Channels may be mapped with raw data or data that is transformed by one or more factors. In some instance data will be converted using a conversion factor to a standard set of units. In one example, pressure may be converted to PSI from another unit such as atmosphere, bar, pascal, gram-force/square centimeter, or other unit or the scale may be manipulated from milli, centi, femto, mega, giga, etc. to a standard value.

Recording Data—FIG. 11 depicts a data acquisition from streaming data. Data is recorded over a time period and then refreshed. In FIG. 11 A, the time interval is 10 second intervals. The data for JobTime is mapped to the time channel, the "TR_PRESS" is mapped to the treatment pressure, "Xlinker_Rate" is mapped to crosslinker, "WLHD_DENS" is mapped to density, "BHP_GAUGE" is mapped to bottom hole pressure, "TOT_SLURRY" is mapped to total fluid, and "SLURRY_RATE" is mapped to pumping rate. Channels may be mapped with raw data or data that is transformed by one or more factors. In some instance data will be converted using a conversion factor to a standard set of units. In one example, pressure may be converted to PSI from another unit such as atmosphere, bar, pascal, gram-force/square centimeter, or other unit or the scale may be manipulated from milli, centi, femto, mega, giga, etc. to a standard value. Dependent upon the treatment type and duration the time interval may be anywhere from seconds, minutes, hours, or even days if required. In some embodiments, different treatments are recorded over different time intervals. The time intervals may be set by the user, pre-set according to treatment, set by the data type, programmed or modeled based on previous data sets. As shown in FIG. 11 B, the "Plot" worksheet the data is now streamlined every 10 s (user entered value).

Figure 12A:
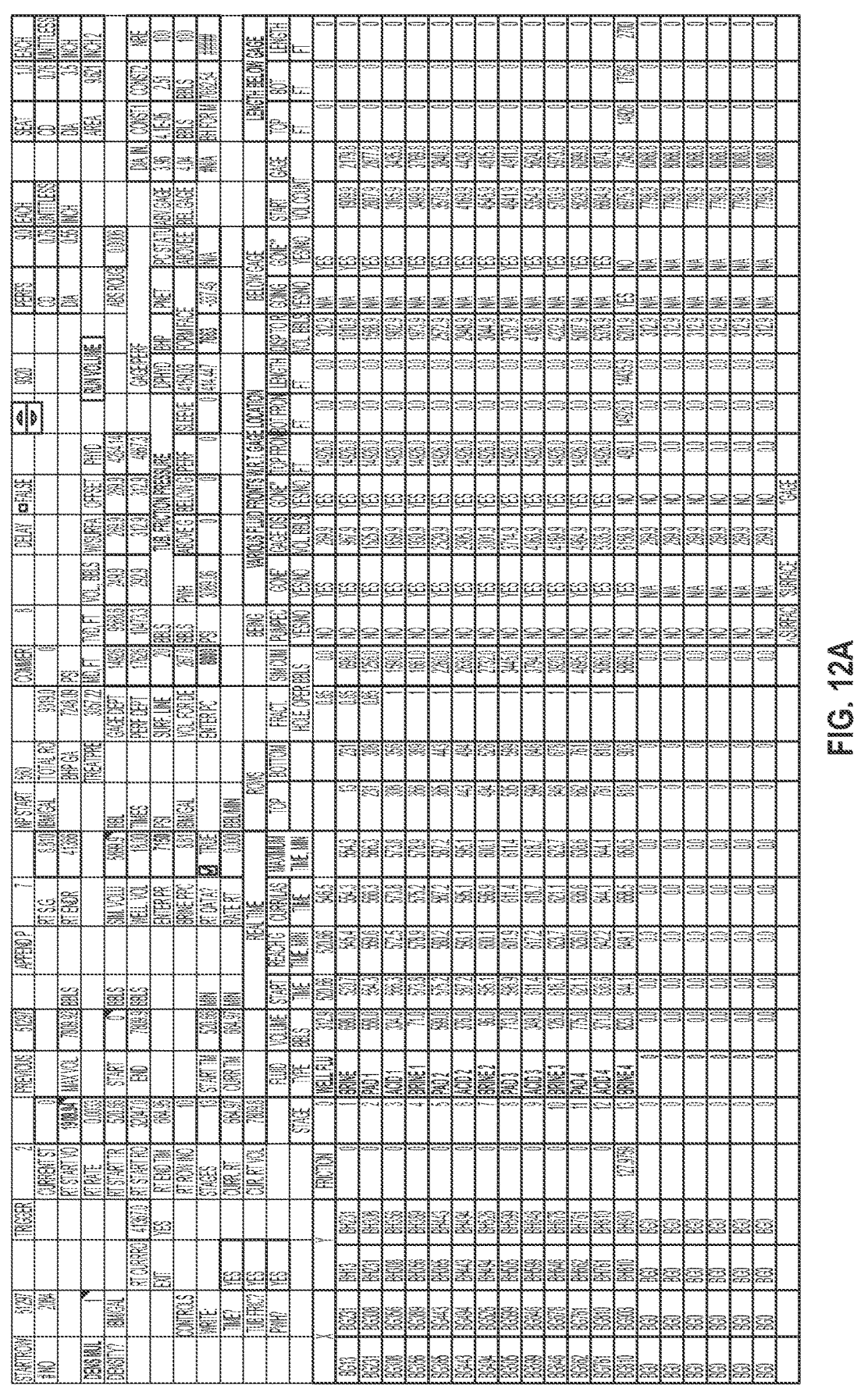
Figure 12B:
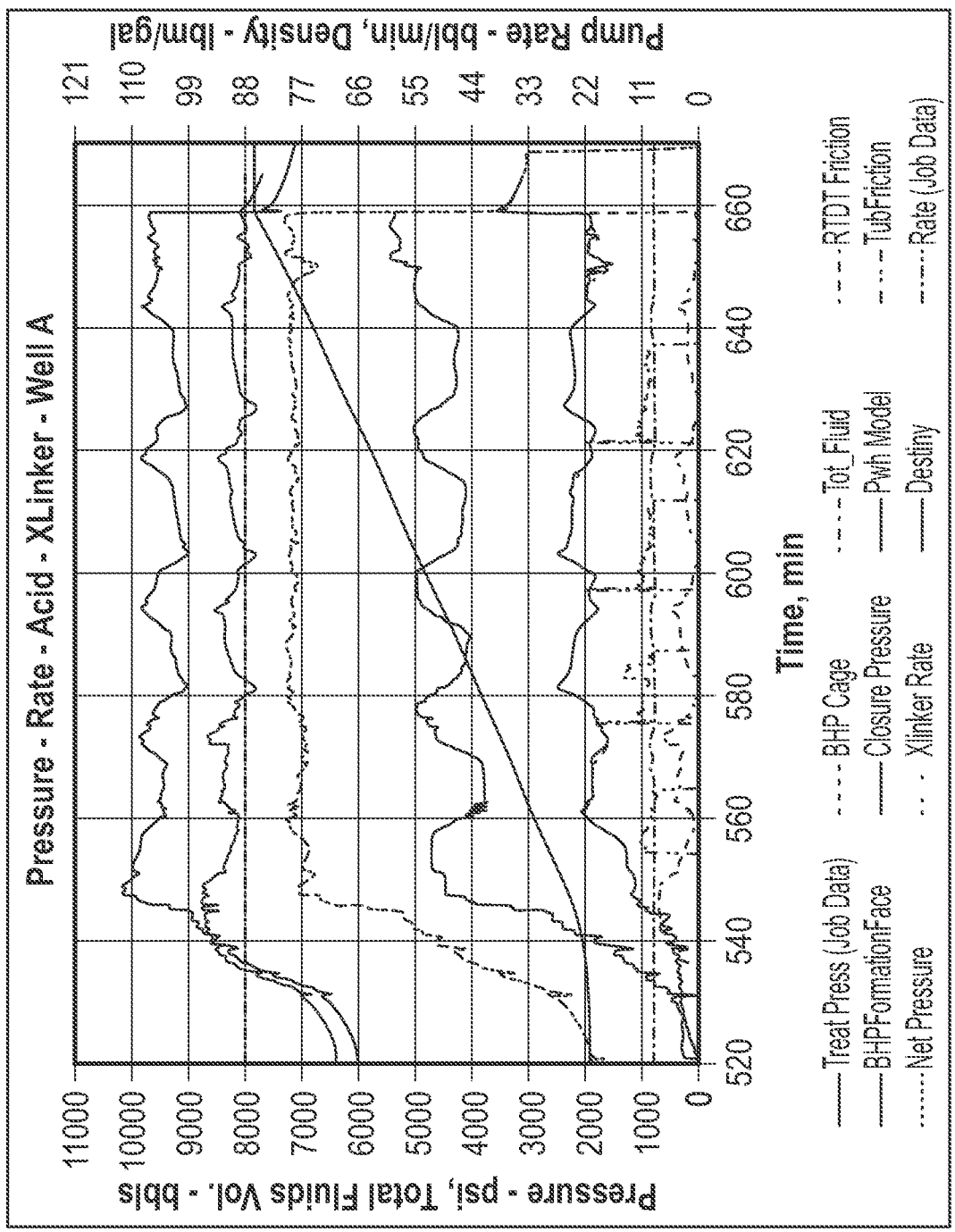
FIG. 12 A shows input and the simulator refreshing the pump schedule based on incoming data.

The Simulator Refreshes Data Recording intervals. FIG. 12 depicts the simulator refreshing the pump schedule based on incoming data. FIG. 12 A provides actual data updated while pumping. The pump schedule, time and data are updated at a predefined interval—in this example every 10 seconds. FIG. 12 B depicts the formation face curve and net pressure curve along with other parameters allowing live monitoring of the treatment while pumping. Pumping schedule, pump rates, treatment times, treatment pressures, and other factors may be monitored and adjusted in real time creating an important feedback loop for safety and ensuring a complete and accurate treatment.

EXAMPLE 2

Figure 13A:
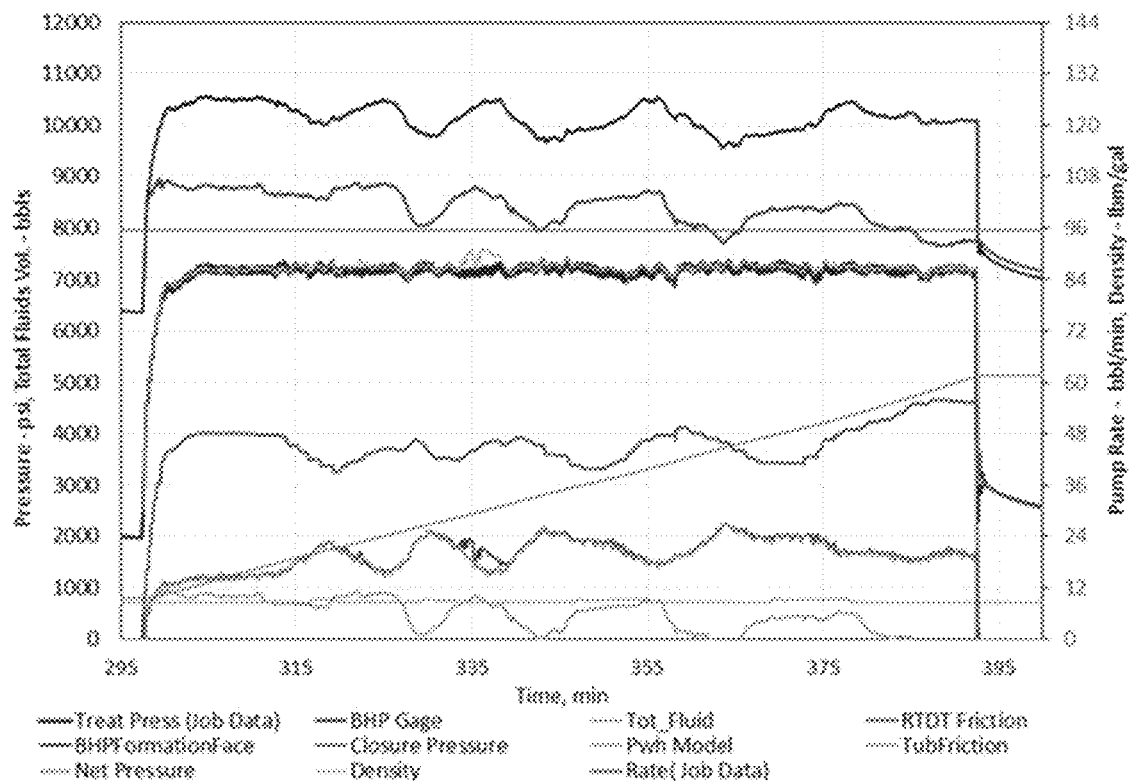
FIG. 13A shows previous data from Zone A.
Figure 13B:
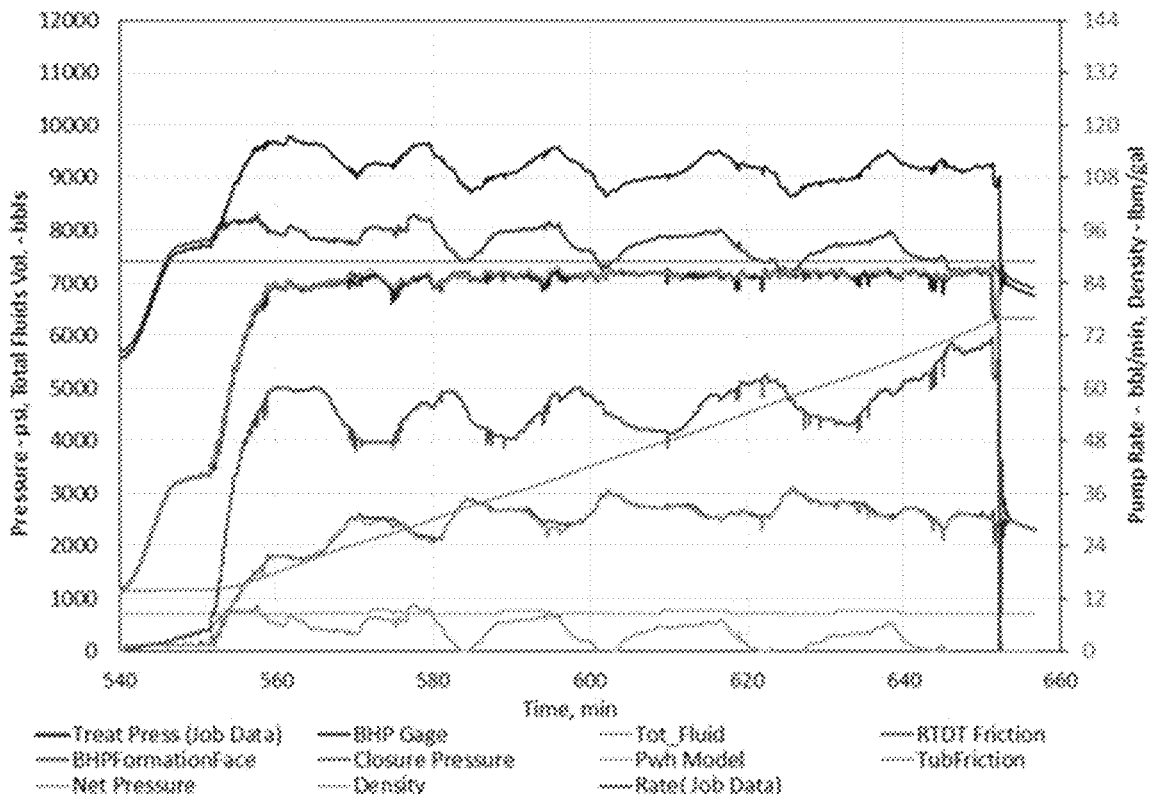
FIG. 13B shows live data collected for Zone B.

Data from Zone A (FIG. 13 A) may be compared to the live data collected for Zone B (FIG. 13 B). The method used for Zone B treatment provided both acquisition and on-the-fly formation face pressure calculations live throughout the treatment. Using live data, the decision was made to increase the third stage pad by 50 bbls and curtail the pad by same amount in last stage. Zone B was a more complex structure with 4 sleeves and lower stresses in comparison to Zone A, therefore higher rates were possible. Using the method allowed a more complex zone to be pumped without having to adjust the model stresses or conduct a preliminary pressure match. Using the observed live data, in Zone B you can see 3rd and 4th treatment cycle goes below closure pressure (Pc). Closure pressure was estimated at approximately 7,400 psi with fracture gradients are around 0.71 psi/ft.

The method provides multiple benefits including containment assurance, tubing integrity/leak detection, estimate volume/rate at reservoir conditions, and drilling/cleanout performance.

Containment assurance estimates the reservoir face pressure of the injector and ensure injection limit is not exceeded. This limits reservoir damage while ensuring the treatment is injected at a high rate. It is always difficult to balance rapid injection for short lived treatments while still getting optimal injection and penetration into the formation.

Tubing integrity and leak detection. By estimating the pressure vs MD in the tubing and in the annulus, operators can identify the depth of tubing/annulus communication. This can be used to either ensure the treatment is penetrating to depth in the reservoir or to identify issues early and implement a corrective strategy prior to damage or wasting time and materials.

Figure 14:
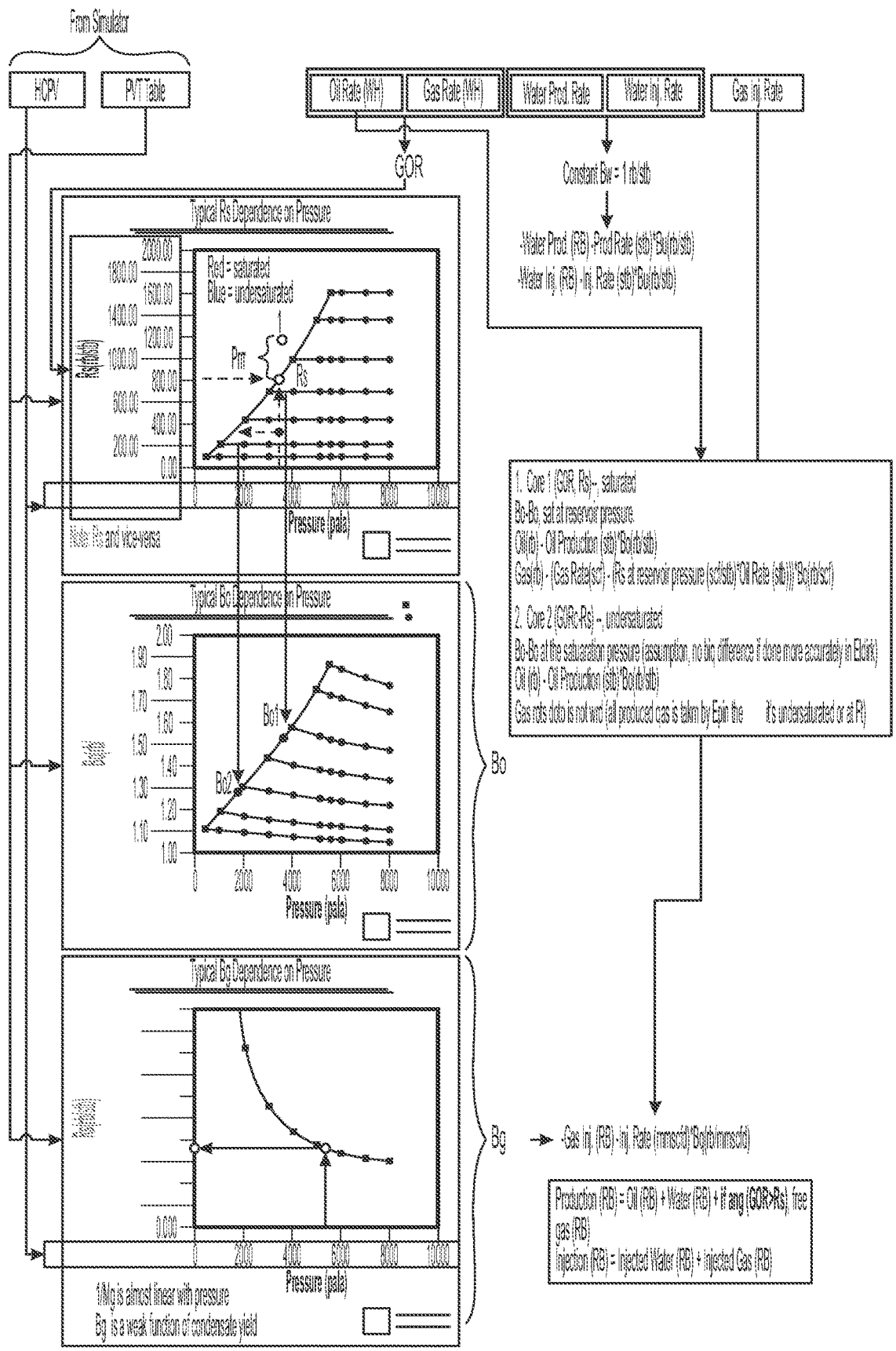
FIG. 14 shows calculation and representation of dynamic GOR data.

Estimate volume/rate at reservoir conditions for PTA, Logging Tool based Hydrocarbon (Gas, Oil, Condensate) and formation water flow rate analysis, Gas Lift Optimization: by entering production data into a PVT model (see FIG. 14) the tool produces a time dependent graph of production at various intervals along the well bore. Gas lift including dry gas, wet gas, and complex volatile oil wells can be mapped in real time to provide valuable information including GOR. Where pressure at different intervals may affect condensation, production, and flow rates.

Drilling/Cleanout Performance: Accurately assess the conditions at the bit or any point in the annular space would be beneficial. A more accurate and detailed assessment of drilling and clean-out may be calculated in real time during drilling. Identification and correction of pump rates while drilling will reduce or completely eliminate problems associated with drill cutting build-up and flow impediment.

In closing, it should be noted that the discussion of any reference is not an admission that it is prior art to the present invention, especially any reference that may have a publication date after the priority date of this application. At the same time, each and every claim below is hereby incorporated into this detailed description or specification as a additional embodiments of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

REFERENCES

All of the references cited herein are expressly incorporated by reference. The discussion of any reference is not an admission that it is prior art to the present invention, especially any reference that may have a publication data after the priority date of this application. Incorporated references are listed again here for convenience:

1. U.S. Pat. No. 8,229,880, Boulatsel & Giovannoli, "Evaluation of Acid Fracturing Treatments in an Oilfield," Schlumberger (2008).
2. U.S. Pat. No. 9,140,109, Suarez-Rivera, et al., "Method for increasing fracture area," Schlumberger (2009).
3. US20090234584, Casey & Abou El Azm, "Data Gathering, Transmission, Integration and Interpretation During Coiled Tubing Well Testing Operations," Schlumberger (2008).
4. US20100006293, Gu, et al., "Fracturing Method for Subterranean Reservoirs," Schlumberger (2008).
5. US20140367110, Montgomery & Johnson, "Geomechanical Weakening with Surface Acting Agents," ConocoPhillips (2013).
6. US20150159477, LeCerf, et al., "Method of Treating a Subterranean Formation," Schlumberger (2013).
7. US20150218439, Dean & Schmidt, "Cryogenic Acid Frack," ConocoPhillips (2014).
8. US20160003017, Keller, et al., "Producing Hydrocarbons from a Formation," ExxonMobil (2013).
9. US20160047230, Livescu & Gupta, "Real-Time Data Acquisition and Interpretation for Coiled Tubing Fluid Injection Operations," Baker Hughes (2013).
10. WO2016134018, Shaposhnikov, et al., "Integrated Well Completions," Schlumberger (2015).

The invention claimed is:

1. A method for treating a hydrocarbon formation comprising:
   a) providing a well in a hydrocarbon formation
      wherein said well is undergoing a hydraulic fracturing treatment, and
      wherein said well comprises one or more systems to measure well parameters;
   b) assembling said well parameters into one or more data packets for transmission;
   c) transmitting one or more data packets from said well to a processor;
   d) receiving one or more data packets at said processor;
   e) aligning the data from one or more data packets with one or more additional sets of data;
   f) parsing said data by parameter into relevant datasets;
   g) transforming said relevant datasets by,
      i) generating composite and dynamic hydrostatic pressure at gauge depth and at perforation depth by converting computed time-based data to capture fluid type then using data rows corresponding to fluid type to compute hydrostatic pressure,
      ii) determining fluid friction below said gauge depth by generating a friction library by fluid type and using bottom hole pressure, surface pressure, and fluid hydrostatics to generate a composite tubular friction,
      iii) calculating pressure drop in the perforation and ball seats, and
      iv) calculating bottom hole reservoir face pressure;
   h) correcting said relevant datasets;
   i) graphing said relevant datasets for a range; and
   j) dynamically changing one or more well processes.

2. The method of claim 1, wherein said relevant dataset is transformed into one or more parameters selected from flow rate, pressure, effective frictional pressure, and effective reservoir face pressure.

3. The method of claim 1, wherein said relevant data is rejected because data parameters fall outside a specified error.

4. The method of claim 1, wherein said data is aligned based on MD, TVD, time, or a combination thereof.

5. The method of claim 1, wherein said relevant dataset is corrected using the closure pressure data, historical data, a data model, or a combination thereof.

6. The method of claim 1, wherein said dynamically changed well process is selected from Pump Schedule Volumes, fluid description, data acquisition frequency, or a combination thereof.

7. A system for treating a hydrocarbon formation comprising:
   a) providing a well in a hydrocarbon formation
      wherein said well is undergoing a hydraulic fracturing treatment, and wherein said well comprises one or more systems to measure well parameters;

b) a transmitter for transmitting data packets to a processor;

c) a processor for receiving data packets from a transmitter; and d) a monitor for displaying one or more graphs;

wherein said transmitter assembles well parameters into one or more data packets for transmission and transmits one or more data packets from said well to said processor;

i) wherein said processor receives one or more data packets from said transmitter and aligns the data from one or more data packets with one or more additional sets of data; parses said data by parameter into relevant datasets; transforms said relevant datasets into flow rate and pressure by generating composite and dynamic hydrostatic pressure at gauge depth and at perforation depth by converting computed time-based data to capture fluid type then using data rows corresponding to fluid type to compute hydrostatic pressure, determining fluid friction below said gauge depth by generating a friction library by fluid type and using bottom hole pressure, surface pressure, and fluid hydrostatics to generate a composite tubular friction, calculating pressure drop in the perforation and ball seats, and calculating bottom hole reservoir face pressure; corrects said relevant datasets; and graphs said relevant datasets for a range.

8. The system of claim 7, wherein said relevant dataset is transformed into one or more parameters selected from flow rate, pressure, effective frictional pressure, and effective reservoir face pressure.

9. The system of claim 7, wherein said relevant data is rejected because data parameters fall outside a specified error.

10. The system of claim 7, wherein said data is aligned based on MD, TVD, time, or a combination thereof.

11. The system of claim 7, wherein said relevant dataset is corrected using the closure pressure data, historical data, a data model, or a combination thereof.

12. The system of claim 7, wherein said dynamically changed well process is selected from Pump Schedule Volumes, fluid description, data acquisition frequency, or a combination thereof.

13. The method of claim 1, wherein said hydraulic fracturing treatment is selected from the group consisting of acid fracturing, propped fracturing, foamed fracturing, fracture acidizing, acid stimulation, propped acid fracture stimulation, hydraulic fracturing, slick water based hydraulic fracturing, foamed based hydraulic fracturing, foam based acid fracturing, and foamed based acid diversion.

14. The system of claim 7, wherein said hydraulic fracturing treatment is selected from the group consisting of acid fracturing, propped fracturing, foamed fracturing, fracture acidizing, acid stimulation, propped acid fracture stimulation, hydraulic fracturing, slick water based hydraulic fracturing, foamed based hydraulic fracturing, foam based acid fracturing, and foamed based acid diversion.

* * * * *